United States Patent [19]

Ito et al.

[11] Patent Number: 5,138,418
[45] Date of Patent: Aug. 11, 1992

[54] TRANSISTOR STRUCTURE FOR TESTING EMITTER-BASE JUNCTION

[75] Inventors: Shinichi Ito; Ziro Terashima, both of Matumoto, Japan

[73] Assignee: Fuji Electric Co., Ltd., Japan

[21] Appl. No.: 532,214

[22] Filed: Jun. 1, 1990

[30] Foreign Application Priority Data

Jun. 5, 1989 [JP] Japan .................................. 1-142609
Jun. 5, 1989 [JP] Japan .................................. 1-142610

[51] Int. Cl.$^5$ ...................... H01L 29/72; H01L 27/02
[52] U.S. Cl. .................................. 357/35; 357/34; 357/36; 357/46; 357/51
[58] Field of Search ................ 357/34, 35, 36, 46, 357/51

[56] References Cited

U.S. PATENT DOCUMENTS 4,782,378 11/1988 Sekiya et al. ........................... 357/36

OTHER PUBLICATIONS

"Microelectronic processing"; W. Scot Ruska; 1987; pp. 9–14.

Primary Examiner—Andrew J. James
Assistant Examiner—Wael Fahmy
Attorney, Agent, or Firm—Brumbaugh, Graves, Donohue & Raymond

[57] ABSTRACT

In accordance with the present invention, a metal electrode in contact with a resistive region formed in a base region is spaced from either a base bonding pad or an emitter electrode. The metal electrode is connected with the pad or the emitter electrode by a lead wire that is rigidly fixed to the pad or the emitter electrode. Before the lead wire is rigidly fixed, no resistor is connected between the emitter and the base. Therefore, it is possible to precisely determine whether the emitter-base junction is good or bad. Further, the invention can be practiced without adding any special manufacturing steps to the prior art techniques. Hence, inexpensive and highly reliable transistors can be put on the market.

5 Claims, 2 Drawing Sheets

TRANSISTOR STRUCTURE FOR TESTING EMITTER-BASE JUNCTION

BACKGROUND OF THE INVENTION

The present invention relates to a transistor having a base region of a first conductivity type in which a resistive region of a second conductivity type is formed, as well as an emitter region of the second conductivity type, the resistive region being connected between the base and the emitter.

It is known to connect a resistor R between the base and the emitter of a transistor, as shown in FIG. 2, to stabilize the transistor. It is also known to form the resistor R as a diffused resistor in the same semiconductor substrate as the transistor is formed. Such a transistor is shown in FIG. 3. This transistor is fabricated by forming a p-type base region 2 in an n-type silicon slab 1 by diffusion and forming an n-type emitter region 3 in the base region 2. A separate n-type belt-shaped region 4 is formed as a resistive region in the base region 2 by the same diffusion process as the process for forming the emitter region 3. The resistive region 4 is connected with the base region 2 and also with an emitter electrode 31 formed in the emitter region 3 by metal electrodes 5 and 6, respectively.

In this transistor, a resistor is inserted between the emitter and the base and, therefore, the emitter-base junction of the transistor shows voltage-current characteristics as shown in FIG. 4. The characteristics are measured between the emitter electrode and the base electrode. When a reverse bias is applied to the junction, $I_{EB}$ exceeds 1 mA. When the transistor substrate is fabricated, the intrinsic value of the emitter-base junction of the transistor, i.e., between of the order of nA and of the order of $\mu A$, cannot be observed. For this reason, it is impossible to remove manufactured products having substrates in which substandard emitter-base junctions are formed. As a result, products having reduced breakdown voltages or products having poor reliability are marketed.

It is an object of the present invention to provide a transistor in which a resistor is connected between the emitter and the base. The transistor is characterized in that the resistor is not connected before assembly.

SUMMARY OF THE INVENTION

The above object is achieved in accordance with the teachings of the invention by a transistor having a base region of a first conductivity type, an emitter region formed in the base region and having a second conductivity type, and a resistive region formed in the base region, having a second conductivity type and connected between the emitter and the base. In one embodiment, a base bonding pad is in contact with the base region and spaced close to a resistive electrode which is in contact with one end of the resistive region. A lead wire is connected with the base bonding pad and in contact with the resistive electrode. In another embodiment, an emitter electrode is in contact with the emitter region and spaced close to a resistive electrode which is in contact with one end of the resistive region. A lead wire is connected with the emitter electrode and in contact with the resistive electrode.

The resistive electrode in contact with the resistive region formed in the base region is not connected with the base bonding pad, or the resistive electrode formed in the resistive region is not connected with the emitter electrode, until a lead wire is connected to the pad or to the emitter electrode during the assembly. Therefore, when a measurement is made before this assembly, no resistor is connected between the emitter and the base. Under this condition, the characteristics of the emitter-base junction can be known.

DESCRIPTION OF THE PREFERRED EMBODIMENTS

Figure 1A:
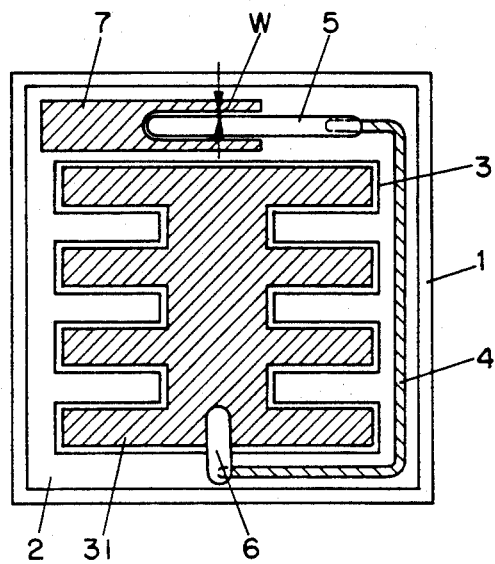
FIGS. 1(a) and 1(b) are plan views of a transistor according to the invention, for showing steps successively performed to manufacture the transistor.
Figure 1B:
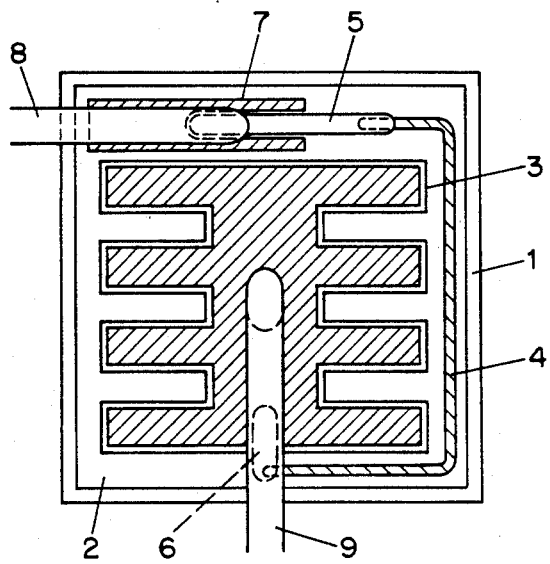
Figure 2:
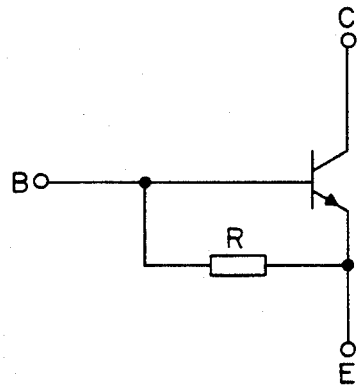
FIG. 2 is an equivalent circuit diagram of the transistor shown in FIGS. 1(a) and 1(b)
Figure 3:
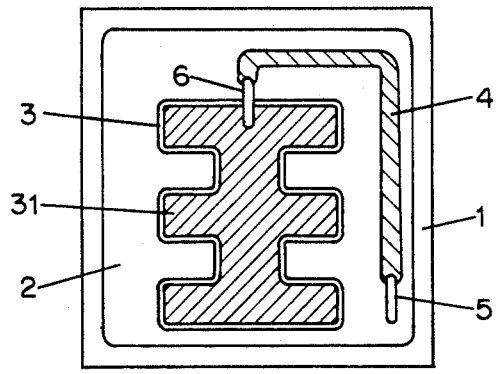
FIG. 3 is a plan view of the prior art transistor.
Figure 4:
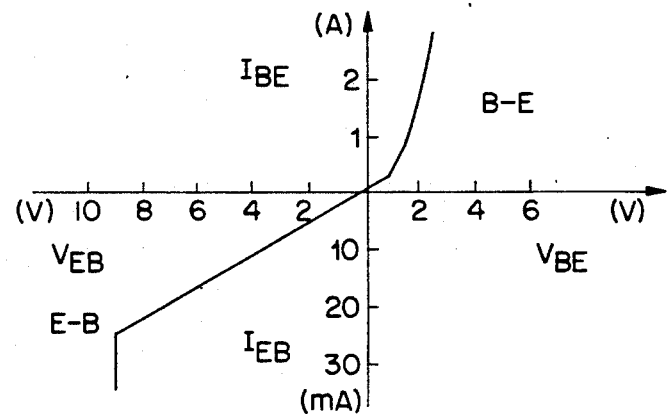
FIG. 4 is a graph showing the voltage-current characteristics measured between the emitter terminal and the base terminal of the transistor shown in FIG. 2.

FIGS. 1(a) and 1(b) show an example of the invention. It is to be noted that like components are indicated by like reference numerals in all the figures including FIG. 3. An n-type resistive region 4 is formed in a p-type base region that is formed in an n-type silicon substrate 1. A metal electrode or resistive electrode 5 which is in contact with one end of the resistive region 4 is electrically insulated from the based region 2 by an insulating film. A base bonding pad 7 is made of a metal film which makes an ohmic contact with the base region. The resistive electrode 5 is inserted in the pad 7 such that a narrow gap W is left between them. The other end of the resistive region 4 is connected via a metal electrode 6 with an emitter electrode 31 on the n-type emitter region 3. When the voltage-current characteristics of the emitter-base junction are measured under the condition shown in FIG. 1(a), the resistor R shown in FIG. 2 is not connected between the emitter and the base. Therefore, the intrinsic value of $I_{EB}$ of the transistor which is of the order of nA to $\mu A$ can be measured. Then, as shown in FIG. 1(b), a lead wire 8 is connected to both metal electrode 5 and the base bonding pad 7 which are spaced from each other by a slight distance of W. Where the lead wire 8 is made of aluminum, the connection is made by bonding. Where the wire is made of gold, the connection is made by soldering. The lead wire 8 is connected with the base terminal. Another lead wire 9 which is connected with the emitter terminal is rigidly fixed to the emitter electrode 31. Thus, it follows that the resistive region 4 is connected between the emitter and the base.

Figure 5A:
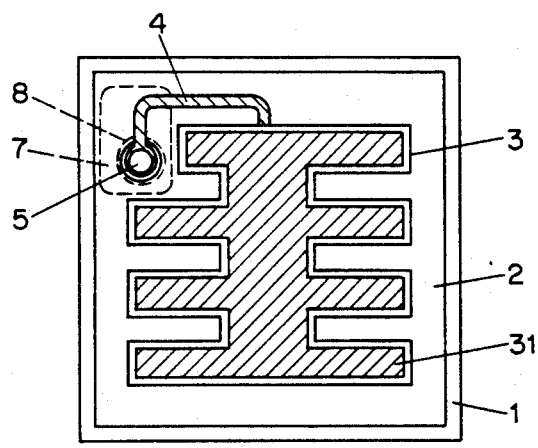
FIG. 5(a) is a plan view of another transistor according to the invention.
Figure 5B:
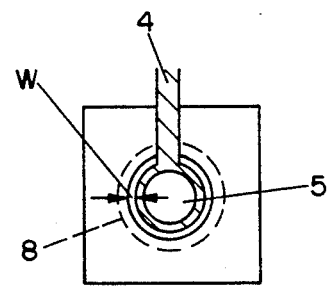
FIG. 5(b) is a fragmentary enlarged plan view of the transistor shown in FIG. 5(a)

FIGS. 5(a) and 5(b) show another example of the invention. FIG. 5(b) is a fragmentary enlarged view of FIG. 5(a). In this example, one end of a resistive region 4 is connected with an emitter region 3. The other end extends under a base bonding pad 7 via an insulating film. The end of the resistive region 4 which is located under the pad 7 is exposed to openings formed in an insulating film and in the pad. A narrow gap W is formed between the electrode 5 and the pad 7. A lead wire 8 is rigidly fixed to both resistive region 4 and base region 2 so as to extend across the gap, as indicated by the broken lines. As a result, the resistive region 4 is connected with the base region 2.

Figure 6A:
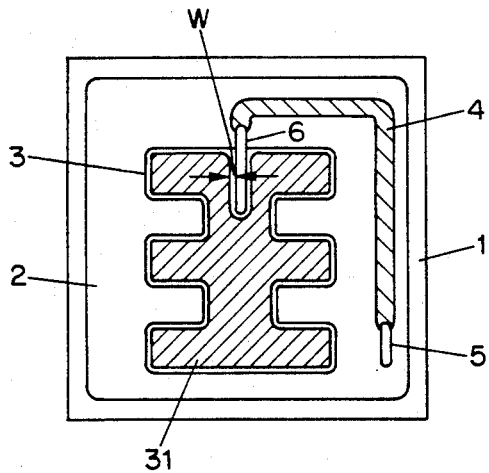
FIGS. 6(a) and 6(b) are plan views of a further transistor according to the invention, for showing manufacturing steps successively performed to fabricate the transistor.
Figure 6B:
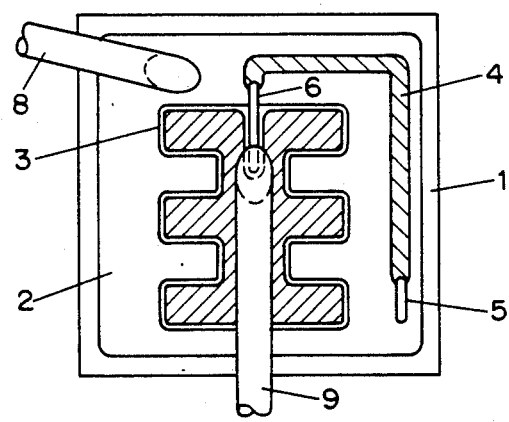

FIGS. 6(a) and 6(b) show a further example of the invention. Like components are denoted by like reference numerals in all the figures including FIGS. 1 and 3. A p-type base region 2 is formed in an n-type silicon substrate 1. An n-type resistive region 4 is formed in the base region 2. A metal electrode or resistive electrode 6 which is in contact with one end of the resistive region 4 extends over an n-type emitter region 3 via an insulating film. The resistive electrode 6 is spaced from an emitter electrode 31 by a small gap W. The other end of the resistive region 4 is connected with the base region via a metal electrode 5. When the voltage-current characteristics of the emitter-base junction are measured in the condition shown in FIG. 6(a), the intrinsic value of $I_{EB}$ of the transistor which is of the order of nA to $\mu A$ can be known, since no resistor is connected between the emitter and the base. Then, as shown in FIG. 6(b), a lead wire 9 is rigidly fixed to the end of the metal electrode 6 and to the emitter electrode 31 which is spaced a distance of W from the end. Where the wire 9 is made of aluminum, it is fixed by wire bonding. Where it is made of gold, it is fixed by soldering. The lead wire 9 is connected with the emitter terminal. Another lead wire 8 which is connected with the base terminal is firmly fixed to the base region 2. Thus, it follows that the resistive region 4 is connected between the emitter and the base.

Figure 7A:
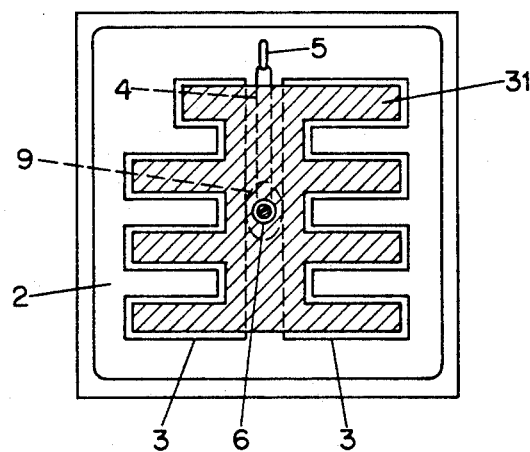
FIG. 7(a) is a plan view of another transistor according to the invention.
Figure 7B:
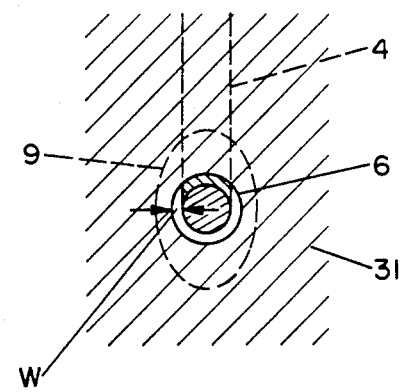
FIG. 7(b) is a fragmentary enlarged plan view of the transistor shown in FIG. 7(a).

FIGS. 7(a) and 7(b) show a still other example of the invention. FIG. 7(b) is a fragmentary enlarged view of FIG. 7(a). In this example, the emitter region 3 is divided into two and has a central portion which acts as an emitter having low capability. A base region 2 extends into this central portion. A resistive region 4 is formed in this central portion. An emitter electrode 31 is formed as a unit and insulated from the central base region 2 and from the resistive region 4 by an insulating film. One end of the resistive region 4 is covered with a metal electrode 6 at the position of an opening formed in the insulating film. The other end is connected with the base region 2 by a metal electrode 5. As shown in the enlarged view of FIG. 7(b), the metal electrode 6 is spaced from the emitter electrode 3 by a distance of W. As indicated by the broken lines, a lead wire 9 is rigidly fixed to both electrodes so as to extend across the gap.

In this way, the resistive region 4 is connected with the emitter region 3.

In the above examples, a single transistor was described. The invention is also applicable to a case in which a resistor is connected between the emitter and the base of the output-stage transistor of a Darlington amplifier. In any case, PNP transistors can be used, as well as NPN transistors.

We claim:

1. A monolithic transistor/resistor combination comprising:
   a substrate of a first conductivity type material functioning as the collector of said transistor;
   a base region of a second conductivity type material formed on said substrate;
   an emitter region of said first conductivity type material formed on said base region;
   a resistive region of said first conductivity type material formed on said base region;
   first means for electrically connecting said resistive region to said emitter region; and
   second means for electrically connecting said resistive region to said base region, one of said first means and said second means being electrically conductive, and the other of said first means and said second means being a lead wire which is open only during testing of said transistor and is closed upon conclusion of said testing to complete electrical connection between said resistive region and said transistor;
   whereby electrical properties characteristic of a base-emitter junction formed by said base region and said emitter region in said transistor can be measured without interference from said resistive region during said testing.

2. The combination of claim 1 in which said first conductivity type material is p-type and said second conductivity type material is n-type.

3. The combination of claim 1 in which said first conductivity type material is n-type and said second conductivity type material is p-type.

4. The combination of claim 1 in which said second means is said lead wire, and said combination further comprises a base bonding pad located near said resistive region and electrically connected to said base region, said lead wire electrically connecting said resistive region to said base bonding pad after said testing.

5. The combination of claim 1 in which said first means is said lead wire, and said combination further comprises an emitter electrode located near said resistive region and electrically connected to said emitter region, said lead wire electrically connecting said resistive region to said emitter electrode after said testing.

* * * * *